United States Patent
Wang

(10) Patent No.: US 10,578,729 B2
(45) Date of Patent: Mar. 3, 2020

(54) RANGING METHOD AND APPARATUS

(71) Applicant: Huawei Technologies Co., Ltd., Shenzhen, Guangdong (CN)

(72) Inventor: Yan Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 291 days.

(21) Appl. No.: 15/677,574

(22) Filed: Aug. 15, 2017

(65) Prior Publication Data

US 2017/0343660 A1 Nov. 30, 2017

Related U.S. Application Data

(63) Continuation of application No. PCT/CN2015/073208, filed on Feb. 16, 2015.

(51) Int. Cl.
*G01S 13/08* (2006.01)
*G01R 31/11* (2006.01)
(Continued)

(52) U.S. Cl.
CPC .............. *G01S 13/08* (2013.01); *G01R 31/11* (2013.01); *G01S 7/354* (2013.01); *G01S 7/41* (2013.01);
(Continued)

(58) Field of Classification Search
CPC ............. G01S 2007/356; G01S 13/345; G01S 13/931; G01S 2013/9375; G01S 13/32;
(Continued)

(56) References Cited

U.S. PATENT DOCUMENTS 5,504,490 A 4/1996 Brendle et al.
6,317,073 B1 * 11/2001 Tamatsu .................. G01S 7/352
342/109
(Continued)

FOREIGN PATENT DOCUMENTS

CN 102203634 A 9/2011
CN 103323837 A 9/2013
(Continued)

OTHER PUBLICATIONS

Borison et al., "Super-Resolution Methods for Wideband Radar," The Lincoln Laboratory Journal, US, Massachusetts Institute of Technology, vol. 5, No. 3, p. 441-461(1992).

*Primary Examiner* — Olumide Ajibade Akonai
(74) *Attorney, Agent, or Firm* — Leydig, Voit & Mayer, Ltd.

(57) ABSTRACT

A ranging method and apparatus are provided. The method includes: sending a ranging signal to a measured system, where the measured system includes at least one reflection point (S110); receiving a first spectrum signal obtained after the ranging signal is reflected by the at least one reflection point (S120); determining a second spectrum signal according to the first spectrum signal, where the second spectrum signal includes the first spectrum signal, and a spectral width of the second spectrum signal is greater than a spectral width of the first spectrum signal (S130); and estimating a distance of the at least one reflection point according to the second spectrum signal (S140). According to the ranging method and apparatus, a distance of a reflection point in a measured system can be determined in a relatively accurate manner, so as to improve ranging accuracy.

16 Claims, 4 Drawing Sheets

(51) Int. Cl.
  *G01S 7/35* (2006.01)
  *G01S 13/06* (2006.01)
  *G01S 7/41* (2006.01)

(52) U.S. Cl.
  CPC ......... *G01S 13/06* (2013.01); *G01S 2007/356* (2013.01)

(58) Field of Classification Search
  CPC ...... G01S 7/352; G01S 15/8977; G01S 17/02; G01S 17/026; G01S 17/32; G01S 13/584; G01S 2007/2883; G01S 13/42; G01S 13/536; G01S 13/08; G01S 13/06; G01S 7/354; G01S 7/41; G01F 23/284
  See application file for complete search history.

(56) References Cited

U.S. PATENT DOCUMENTS

| | | | |
|---|---|---|---|
| 7,472,152 B1 * | 12/2008 | Tsui | G06F 17/141 708/403 |
| 7,872,583 B1 | 1/2011 | Yushkov et al. | |
| 8,232,914 B2 | 7/2012 | Kuroda et al. | |
| 2005/0046609 A1 | 3/2005 | Wasiewicz | |
| 2009/0295623 A1 * | 12/2009 | Falk | G01S 7/023 342/109 |
| 2013/0182753 A1 | 7/2013 | Delforce et al. | |
| 2014/0146866 A1 | 5/2014 | Strachan et al. | |
| 2015/0097713 A1 * | 4/2015 | Nakai | G01S 13/04 342/27 |
| 2015/0160346 A1 | 6/2015 | Stutz | |
| 2015/0338514 A1 | 11/2015 | Sato et al. | |
| 2015/0378016 A1 * | 12/2015 | Schoor | G01S 13/345 342/21 |
| 2017/0026798 A1 | 1/2017 | Prevatt | |

FOREIGN PATENT DOCUMENTS

| | | |
|---|---|---|
| DE | 19727288 A1 | 1/1999 |
| EP | 2680028 A1 | 1/2014 |
| JP | S58-44368 A | 3/1983 |
| JP | S60-63479 A | 4/1985 |
| JP | 2003161775 A | 6/2003 |
| JP | 2005338004 A | 12/2005 |
| JP | 2010-266400 A | 11/2010 |
| JP | 2011232045 A | 11/2011 |
| WO | 2014106907 A1 | 7/2014 |

* cited by examiner

RANGING METHOD AND APPARATUS

CROSS-REFERENCE TO RELATED APPLICATIONS

This application is a continuation of International Application No. PCT/CN2015/073208, filed on Feb. 16, 2015, the disclosure of which is hereby incorporated by reference in its entirety.

TECHNICAL FIELD

Embodiments of the present disclosure relate to the data processing field, and more specifically, to a ranging method and apparatus.

BACKGROUND

In a current process of measuring a fault point in a radio frequency system by using a scanning rangefinder, a series of test signals are usually transmitted into the radio frequency system. The test signal is reflected after arriving at the fault point. Accordingly, a receiver receives a spectrum signal obtained by reflecting by the fault point. Then a transmission delay d between transmission and reception of the test signal is estimated according to a curve chart of a time-domain signal corresponding to the received spectrum signal. A distance s between a transmitter and the fault point is obtained after the transmission delay d is multiplied by a radio wave speed V and then divided by 2. However, currently, a curve in the curve chart of the time-domain signal corresponding to the received spectrum signal is often deformed or has an obvious distortion. Consequently, accuracy of detecting the fault point is severely affected.

SUMMARY

Embodiments of the present disclosure provide a ranging method and apparatus, so as to determine a distance of a reflection point in a measured system in a relatively accurate manner, and improve ranging accuracy.

A first aspect provides a ranging method, and the method includes:

sending a ranging signal to a measured system, where the measured system includes at least one reflection point;

receiving a first spectrum signal obtained after the ranging signal is reflected by the at least one reflection point;

determining a second spectrum signal according to the first spectrum signal, where the second spectrum signal includes the first spectrum signal, and a spectral width of the second spectrum signal is greater than a spectral width of the first spectrum signal; and estimating a distance of the at least one reflection point according to the second spectrum signal.

With reference to the first aspect, in a first possible implementation of the first aspect, the determining a second spectrum signal according to the first spectrum signal includes:

determining a mathematical model used to express the first spectrum signal; and determining the second spectrum signal according to the mathematical model.

With reference to the first possible implementation of the first aspect, in a second possible implementation of the first aspect, the second spectrum signal includes a third spectrum signal, and a lowest frequency of the third spectrum signal is higher than a highest frequency of the first spectrum signal; and the determining a mathematical model used to express the first spectrum signal includes:

performing mathematical modeling on the first spectrum signal by using a forward finite impulse response recursive filter, so as to obtain a first mathematical model used to express a high frequency signal in the first spectrum signal.

With reference to the second possible implementation of the first aspect, in a third possible implementation of the first aspect, the performing mathematical modeling on the first spectrum signal by using a forward finite impulse response recursive filter, so as to obtain a first mathematical model used to express a high frequency signal in the first spectrum signal includes:

determining the first mathematical model $\hat{X}1(f_k)$ according to the following formula:

$$\hat{X}1(f_k) = \sum_{i=1}^{L1} C_i \cdot X(f_{k-i}), k = 1 + L1, \ldots, Q$$

where $X(f_{k-i})$ a frequency response of a frequency $f_{k-i}$ in the first spectrum signal, $f_1$ is a lowest frequency of the first spectrum signal, $f_Q$ is the highest frequency of the first spectrum signal, Q is a quantity of frequencies in the first spectrum signal, L1 is an integer less than or equal to Q/2, and a coefficient vector $C=(C_1, C_2, \ldots, C_{L1})$ is obtained according to the following formula:

$$e1(f_k)=X(f_k)-\hat{X}1(f_k)$$

where $X(f_k)$ is a frequency response of a frequency $f_k$ in the first spectrum signal, $e1(f_k)$ is a modeling error, and $e1(f_k)$ uses a criterion in which a p-norm measure is smallest.

With reference to any one of the first to the third possible implementations of the first aspect, in a fourth possible implementation of the first aspect, the second spectrum signal includes a fourth spectrum signal, and a highest frequency of the fourth spectrum signal is lower than the lowest frequency of the first spectrum signal; and the determining a mathematical model used to express the first spectrum signal includes:

performing mathematical modeling on the first spectrum signal by using a backward finite impulse response recursive filter, so as to obtain a second mathematical model used to express a low frequency signal in the first spectrum signal.

With reference to the fourth possible implementation of the first aspect, in a fifth possible implementation of the first aspect, the performing mathematical modeling on the first spectrum signal by using a backward finite impulse response recursive filter, so as to obtain a second mathematical model used to express a low frequency signal in the first spectrum signal includes:

determining the second mathematical model $\hat{X}2(f_k)$ according to the following formula:

$$\hat{X}2(f_k) = \sum_{i=1}^{L2} B_i \cdot X(f_{k+i}), k = 1, 2, \ldots, Q-L2$$

where $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is the quantity of frequencies in the first spectrum signal, L2 is an integer less than or equal to Q/2, and a coefficient vector B=(B$_1$, B$_2$, ..., B$_{L2}$) is obtained according to the following formula:

$$e2(f_k)=X(f_k)-\hat{X}2(f_k)$$

where $X(f_k)$ is the frequency response of the frequency $f_k$ in the first spectrum signal, $e2(f_k)$ is a modeling error, and $e2(f_k)$ uses a criterion in which a p-norm measure is smallest.

With reference to the first possible implementation of the first aspect, in a sixth possible implementation of the first aspect, the determining a mathematical model used to express the first spectrum signal includes:

fitting frequency responses of the first spectrum signal by using a finite impulse response recursive filter, so as to determine the mathematical model.

With reference to the sixth possible implementation of the first aspect, in a seventh possible implementation of the first aspect, the fitting frequency responses of the first spectrum signal by using a finite impulse response recursive filter, so as to determine the mathematical model includes:

determining the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

where N is equal to Q, Q is a quantity of frequencies in the first spectrum signal, L3 is an integer less than N, and a coefficient vector C=(C$_0$, C$_1$, ..., C$_{L3-1}$) is obtained according to the following formula:

$$e3(f_k)=X(f_k)-Y(f_k)$$

where $X(f_k)$ is a frequency response of a frequency $f_k$ in the first spectrum signal, $e3(f_k)$ is a fitting error, $e3(f_k)$ uses a criterion in which a p-norm measure is smallest, $f_1$ is a lowest frequency of the first spectrum signal, and $f_Q$ is a highest frequency of the first spectrum signal.

With reference to the first aspect, in an eighth possible implementation of the first aspect, the determining a second spectrum signal according to the first spectrum signal includes:

obtaining the second spectrum signal according to the first spectrum signal by using a finite impulse response recursive filter whose group delay is −1.

With reference to any one of the first aspect or the first to the eighth possible implementations of the first aspect, in a ninth possible implementation of the first aspect, the estimating a distance of the at least one reflection point according to the second spectrum signal includes:

obtaining a time-domain signal corresponding to the second spectrum signal;

generating a time-amplitude curve chart of the time-domain signal; and estimating the distance of the at least one reflection point according to a wave peak location in the time-amplitude curve chart.

With reference to the ninth possible implementation of the first aspect, in a tenth possible implementation of the first aspect, a quantity of wave peaks included in the time-amplitude curve chart is S, and the estimating the distance of the at least one reflection point according to a wave peak location in the time-amplitude curve chart includes:

generating an $i^{th}$ standard sine curve according to a location of an $i^{th}$ wave peak, where a main lobe of the $i^{th}$ standard sine curve is at the location of the $i^{th}$ wave peak, and i is 1, 2, ..., or S;

determining a projection value of each standard sine curve on a time-amplitude curve chart of a time-domain signal corresponding to the first spectrum signal; and estimating the distance of the at least one reflection point according to a main lobe location of a target standard sine curve, where the target standard sine curve is a standard sine curve that is in the S standard sine curves and whose projection value is greater than or equal to a preset threshold.

A second aspect provides a ranging apparatus, and the apparatus includes:

a sending module, configured to send a ranging signal to a measured system, where the measured system includes at least one reflection point;

a receiving module, configured to receive a first spectrum signal obtained after the ranging signal sent by the sending module is reflected by the at least one reflection point;

a determining module, configured to determine a second spectrum signal according to the first spectrum signal received by the receiving module, where the second spectrum signal includes the first spectrum signal, and a spectral width of the second spectrum signal is greater than a spectral width of the first spectrum signal; and an estimation module, configured to estimate a distance of the at least one reflection point according to the second spectrum signal determined by the determining module.

With reference to the second aspect, in a first possible implementation of the second aspect, the determining module includes:

a first determining unit, configured to determine a mathematical model used to express the first spectrum signal; and a second determining unit, configured to determine the second spectrum signal according to the mathematical model determined by the first determining unit.

With reference to the first possible implementation of the second aspect, in a second possible implementation of the second aspect, the second spectrum signal comprises a third spectrum signal, and a lowest frequency of the third spectrum signal is higher than a highest frequency of the first spectrum signal, and the second determining unit includes:

a first modeling subunit, configured to perform mathematical modeling on the first spectrum signal by using a forward finite impulse response recursive filter, so as to obtain a first mathematical model used to express a high frequency signal in the first spectrum signal.

With reference to the second possible implementation of the second aspect, in a third possible implementation of the second aspect, the first modeling subunit is specifically configured to determine the first mathematical model $\hat{X}1(k)$ according to the following formula:

$$\hat{X}1(f_k) = \sum_{i=1}^{L1} C_i \cdot X(f_{k-i}), k = 1+L1 \ldots, Q$$

where $X(f_{k-i})$ is a frequency response of a frequency $f_{k-i}$ in the first spectrum signal, $f_1$ is a lowest frequency of the first spectrum signal, $f_Q$ is the highest frequency of the first spectrum signal, Q is a quantity of frequencies in the first spectrum signal, L1 is an integer less than or equal to Q/2, and a coefficient vector C=(C$_1$, C$_2$, ..., C$_{L1}$) is obtained according to the following formula:

$$e1(f_k)=X(f_k)-\hat{X}1(f_k)$$

where $X(f_k)$ is a frequency response of a frequency $f_k$ in the first spectrum signal, $e1(f_k)$ is a modeling error, and $e1(f_k)$ uses a criterion in which a p-norm measure is smallest.

With reference to any one of the first to the third possible implementations of the second aspect, in a fourth possible implementation of the second aspect, the second spectrum signal includes a fourth spectrum signal, and a highest frequency of the fourth spectrum signal is lower than the lowest frequency of the first spectrum signal; and the second determining unit includes:

a second modeling subunit, configured to perform mathematical modeling on the first spectrum signal by using a backward finite impulse response recursive filter, so as to obtain a second mathematical model used to express a low frequency signal in the first spectrum signal.

With reference to the fourth possible implementation of the second aspect, in a fifth possible implementation of the second aspect, the second modeling subunit is specifically configured to determine the second mathematical model $\hat{X}2(f_k)$ according to the following formula:

$$\hat{X}2(f_k) = \sum_{i=1}^{L2} B_i \cdot X(f_{k+i}), k = 1, 2, \ldots, Q - L2$$

where $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is the quantity of frequencies in the first spectrum signal, L2 is an integer less than or equal to Q/2, and a coefficient vector $B=(B_1, B_2, \ldots, B_{L2})$ is obtained according to the following formula:

$$e2(f_k) = X(f_k) - \hat{X}2(f_k)$$

where $X(f_k)$ is the frequency response of the frequency $f_k$ in the first spectrum signal, $e2(f_k)$ a modeling error, and $e2(f_k)$ uses a criterion in which a p-norm measure is smallest.

With reference to the first possible implementation of the second aspect, in a sixth possible implementation of the second aspect, the first determining unit is specifically configured to fit frequency responses of the first spectrum signal by using a finite impulse response recursive filter, so as to determine the mathematical model.

With reference to the sixth possible implementation of the second aspect, in a seventh possible implementation of the second aspect, the first determining unit is specifically configured to determine the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

where N is equal to Q, Q is a quantity of frequencies in the first spectrum signal, L3 is an integer less than N, and a coefficient vector $C=(C_0, C_1, \ldots, C_{L3-1})$ is obtained according to the following formula:

$$e3(f_k) = X(f_k) - Y(f_k)$$

where $X(f_k)$ is a frequency response of a frequency $f_k$ in the first spectrum signal, $e3(f_k)$ is a fitting error, $e3(f_k)$ uses a criterion m which a p-norm measure is smallest, $f_1$ is a lowest frequency of the first spectrum signal, and $f_Q$ is a highest frequency of the first spectrum signal.

With reference to the second aspect, in an eighth possible implementation of the second aspect, the determining module is specifically configured to obtain the second spectrum signal according to the first spectrum signal by using a finite impulse response recursive filter whose group delay is −1.

With reference to any one of the second aspect or the first to the eighth possible implementations of the second aspect, in a ninth possible implementation of the second aspect, the estimation module includes:

an obtaining unit, configured to obtain a time-domain signal corresponding to the second spectrum signal;

a generation unit, configured to generate a time-amplitude curve chart of the time-domain signal obtained by the obtaining unit; and an estimation unit, configured to estimate the distance of the at least one reflection point according to a wave peak location in the time-amplitude curve chart generated by the generation unit.

With reference to the ninth possible implementation of the second aspect, in a tenth possible implementation of the second aspect, a quantity of wave peaks included in the time-amplitude curve chart generated by the generation unit is S, and the estimation unit includes:

a generation subunit, configured to generate an $i^{th}$ standard sine curve according to a location of an $i^{th}$ wave peak in the time-amplitude curve chart generated by the generation unit, where a main lobe of the $i^{th}$ standard sine curve is at the location of the $i^{th}$ wave peak, and i is 1, 2, ..., or S;

a fourth determining subunit, configured to determine a projection value of each standard sine curve generated by the generation subunit on a time-amplitude curve chart of a time-domain signal corresponding to the first spectrum signal; and an estimation subunit, configured to estimate the distance of the at least one reflection point according to a main lobe location of a target standard sine curve determined by the fourth determining subunit, where the target standard sine curve is a standard sine curve that is in the S standard sine curves and whose projection value is greater than or equal to a preset threshold.

Based on the foregoing technical solutions, in the embodiments of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
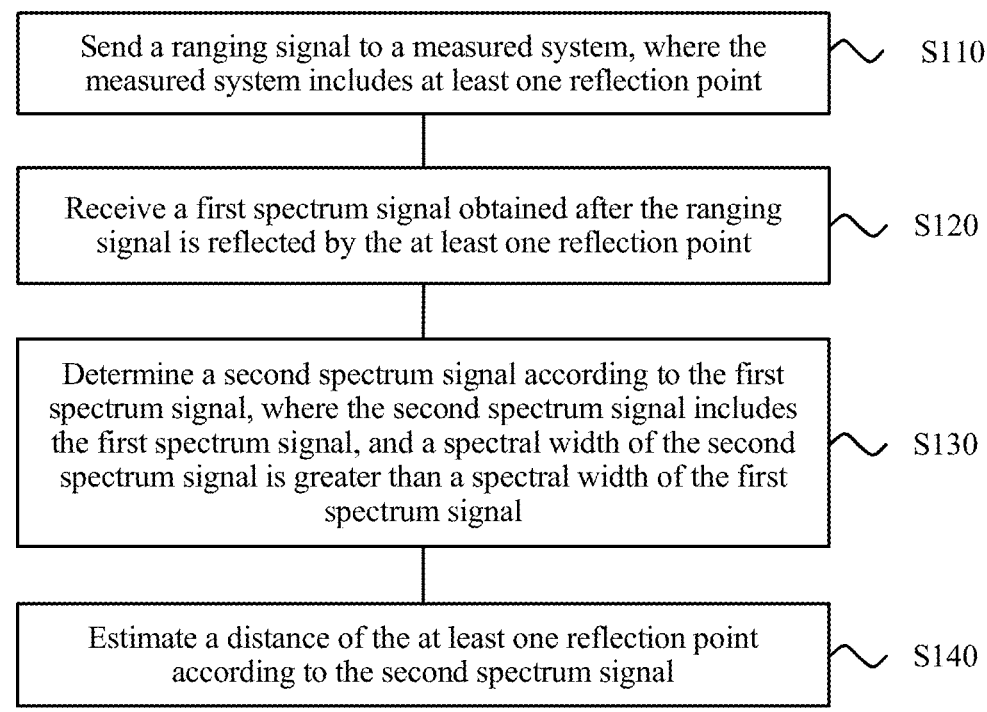
FIG. 1 shows a schematic flowchart of a ranging method according to an embodiment of the present disclosure.

FIG. 1 shows a ranging method 100 according to an embodiment of the present disclosure. The method 100 is executed by, for example, a scanning rangefinder. As shown in FIG. 1, the method 100 includes the following steps.

S110. Send a ranging signal to a measured system, where the measured system includes at least one reflection point.

In a specific example, a transmitter of a scanning rangefinder sends a ranging signal to a measured system, the measured system includes at least one reflection point, and the ranging signal is reflected after arriving at the at least one reflection point.

The measured system may be a radio frequency system.

The reflection point related in this specification may also be referred to as a fault point or a target point. Specifically, the reflection point may be a target point in a frequency domain reflectometer (Frequency Domain Reflectometer, "FDR" for short), passive intermodulation (Passive Inter-Modulation, "PIM" for short), or the like.

S120. Receive a first spectrum signal obtained after the ranging signal is reflected by the at least one reflection point.

In a specific example, a receiver of the scanning rangefinder receives the first spectrum signal obtained by reflecting by the at least one reflection point.

The first spectrum signal may be a same signal as the sent ranging signal, or may be a high-order harmonic component of the ranging signal. For example, when a PIM fault of a radio frequency system is detected, a spectrum signal obtained by reflecting by the reflection point is a high-order harmonic component of a sent ranging signal.

S130. Determine a second spectrum signal according to the first spectrum signal, where the second spectrum signal includes the first spectrum signal, and a spectral width of the second spectrum signal is greater than a spectral width of the first spectrum signal.

A spectral range of the second spectrum signal includes a spectral range of the first spectrum signal, a part of the second spectrum signal is the same as the first spectrum signal, and the spectral width of the second spectrum signal is greater than the spectral width of the first spectrum signal.

Specifically, the spectral range of the second spectrum signal and the spectral range of the first spectrum signal have the following three different relationships, and this is not limited in this embodiment of the present disclosure.

1) A lowest frequency of the second spectrum signal is lower than a lowest frequency of the first spectrum signal, and a highest frequency of the second spectrum signal is higher than a highest frequency of the first spectrum signal.

2) A lowest frequency of the second spectrum signal is equal to a lowest frequency of the first spectrum signal, and a highest frequency of the second spectrum signal is higher than a highest frequency of the first spectrum signal.

3) A lowest frequency of the second spectrum signal is lower than a lowest frequency of the first spectrum signal, and a highest frequency of the second spectrum signal is equal to a highest frequency of the first spectrum signal.

S140. Estimate a distance of the at least one reflection point according to the second spectrum signal.

The distance of the at least one reflection point is a distance between each reflection point in the at least one reflection point and the transmitter, or a distance between each reflection point in the at least one reflection point and a preset reference point.

In a specific example, a time-domain signal corresponding to the second spectrum signal is obtained, a time-amplitude curve chart of the time-domain signal is generated, a transmission delay d between transmission and reception of the ranging signal (that is, reception of the first spectrum signal obtained after the ranging signal is reflected by the at least one reflection point) may be estimated according to a wave peak location in the time-amplitude curve chart, and then a distance s between the at least one reflection point and the transmitter is obtained by means of calculation according to the following formula:

$$s = d \cdot V/2 \qquad (1)$$

where V is a radio wave speed.

It should be understood that a greater spectral bandwidth of a spectrum signal indicates a narrower and sharper wave peak in a time-amplitude curve chart of a time-domain signal corresponding to the spectrum signal, so as to more conveniently and accurately detect a location of the wave peak, obtain a relatively accurate transmission delay d of a ranging signal, and measure a distance of a reflection point in a relatively accurate manner.

Therefore, in the ranging method provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

In S130, specifically, mathematical fitting may be performed on the first spectrum signal to obtain a mathematical model used to express the first spectrum signal, and then the second spectrum signal is determined based on the mathematical model; or the first spectrum signal may be input into a finite impulse response recursive filter whose group delay is −1, so as to output the second spectrum signal, and details are described in the following.

Optionally, in this embodiment of the present disclosure, the determining a second spectrum signal according to the first spectrum signal in S130 includes the following steps.

S131. Determine a mathematical model used to express the first spectrum signal.

In a specific example, mathematical fitting is performed on the first spectrum signal X(f), to obtain the mathematical model to express the first spectrum signal X(f). It should be understood that the system herein may be a physical path between a receiver and a transmitter over a wireless or wired channel.

It should be further understood that the first spectrum signal X(f) may include a variable in two dimensions, that is, frequency and amplitude.

S132. Determine the second spectrum signal according to the mathematical model.

Specifically, a spectrum signal beyond the spectral range of the first spectrum signal X(f) is speculated according to the mathematical model determined in S131, such as a low-frequency spectrum signal at a frequency lower than the lowest frequency $f_1$ of the first spectrum signal X(f), or a high-frequency spectrum signal at a frequency higher than the highest frequency $f_Q$ of the first spectrum signal X(f). Then the second spectrum signal is determined according to the low frequency signal, the high frequency signal, and the first spectrum signal.

Optionally, in this embodiment of the present disclosure, the second spectrum signal includes a third spectrum signal. A lowest frequency of the third spectrum signal is higher than the highest frequency $f_Q$ of the first spectrum signal, and the determining a mathematical model used to express the first spectrum signal in S131 includes the following steps.

S131A. Perform mathematical modeling on the first spectrum signal by using a forward finite impulse response (Finite Impulse Response, "FIR" for short) recursive filter, so as to obtain a first mathematical model used to express a high frequency signal in the first spectrum signal.

Specifically, it is assumed that the first spectrum signal includes data on frequencies $f_1, f_2, \ldots,$ and $f_Q$, that is, the first spectrum signal includes Q pieces of data. $f_1$ is the lowest frequency of the first spectrum signal, and $f_Q$ is the highest frequency of the first spectrum signal. It may be understood that, for example, all intervals between the frequencies $f_1, f_2, \ldots,$ and $f_Q$ may be the same.

A spectrum response corresponding to a frequency $f_k$ of the first spectrum signal is expressed by using a linear combination of spectrum responses of L1 neighboring frequencies on the left side of the frequency $f_k$, so as to obtain the first mathematical model used to express frequency responses of a frequency $f_{1+L1}$ to a frequency $f_Q$ that are of the first spectrum signal. k=1+L1 ..., Q, where L1 is an integer less than or equal to Q/2.

Optionally, in this embodiment of the present disclosure, the performing mathematical modeling on the first spectrum signal by using a forward finite impulse response recursive filter, so as to obtain a first mathematical model used to express a high frequency signal in the first spectrum signal in S131A includes:

determining the first mathematical model $\hat{X}1(f_k)$ according to the following formula:

$$\hat{X}1(f_k) = \sum_{i=1}^{L1} C_i \cdot X(f_{k-i}), k = 1 + L1 \ldots, Q \qquad (2)$$

where $X(f_{k-i})$ is a frequency response of a frequency $f_{k-i}$ in the first spectrum signal, $f_1$ is the lowest frequency of the first spectrum signal, $f_Q$ is the highest frequency of the first spectrum signal, Q is a quantity of frequencies in the first spectrum signal, L1 is an integer less than or equal to Q/2, and a coefficient vector $C=(C_1, C_2, \ldots, C_{L1})$ is obtained according to the following formula:

$$e1(f_k) = X(f_k) - \hat{X}1(f_k) \qquad (3)$$

where $X(f_k)$ is a frequency response of a frequency $f_k$ in the first spectrum signal, $e1(f_k)$ is a modeling error, and $e1(f_k)$ uses a criterion in which a p-norm measure is smallest.

Specifically, an optimal solution $C=(C_1, C_2, \ldots, C_{L1})$ for formula (2) may be obtained by using the criterion in which a p-norm measure of the modeling error $e1(f_k)$ is smallest, and by controlling a gain fluctuation range of the FIR recursive filter. Specifically, the least square method or another related mathematical method may be used to obtain the optimal solution $C=(C_1, C_2, \ldots, C_{L1})$ for formula (2), and this is not limited in this embodiment of the present disclosure.

The optimal solution $C=(C_1, C_2, \ldots, C_{L1})$ for formula (2) is substituted into formula (2) to obtain the first mathematical model $\hat{X}1(f_k)$, and then spectrum signals on frequencies $f_h, f_{h+1}, \ldots, f_{h+m}$ are estimated one by one to obtain the third spectrum signal $\hat{X}1(f_h), \hat{X}1(f_{h+1}), \ldots \hat{X}1(f_{h+m})$. $f_h$ is the lowest frequency of the third spectrum signal, $f_{h+m}$ is a highest frequency of the third spectrum signal, the lowest frequency $f_h$ of the third spectrum signal is higher than the highest frequency $f_Q$ of the first spectrum signal, and the highest frequency $f_{h+m}$ of the third spectrum signal is also the highest frequency of the second spectrum signal. It may be understood that, for example, all intervals between frequencies $f_h, f_{h+1}, \ldots, f_{h+m}$ may be the same, and the interval is the same as an interval between $f_h$ and $f_Q$, and also the same as the interval between the frequencies $f_1, f_2, \ldots,$ and $f_Q$.

Optionally, in this embodiment of the present disclosure, the second spectrum signal includes a fourth spectrum signal. A highest frequency of the fourth spectrum signal is lower than the lowest frequency $f_1$ of the first spectrum signal, and the determining a mathematical model used to express the first spectrum signal in S131 includes the following steps.

S131B. Perform mathematical modeling on the first spectrum signal by using a backward finite impulse response (FIR) recursive filter, so as to obtain a second mathematical model used to express a low frequency signal in the first spectrum signal.

Specifically, it is assumed that the first spectrum signal includes data on frequencies $f_1, f_2, \ldots,$ and $f_Q$, that is, the first spectrum signal includes Q pieces of data. $f_1$ is the lowest frequency of the first spectrum signal, and $f_Q$ is the highest frequency of the first spectrum signal.

A spectrum response corresponding to a frequency $f_k$ of the first spectrum signal is expressed by using a linear combination of spectrum responses of L2 neighboring frequencies on the right side of the frequency $f_k$, so as to obtain the first mathematical model used to express frequency responses of a frequency $f_1$ to a frequency $f_{Q-L2}$ that are of the first spectrum signal. k=1, 2, ..., Q–L2, where L2 is an integer less than or equal to Q/2.

Optionally, in this embodiment of the present disclosure, the performing mathematical modeling on the first spectrum signal by using a backward finite impulse response recursive filter, so as to obtain a second mathematical model used to express a low frequency signal in the first spectrum signal in S131B includes:

determining the second mathematical model $\hat{X}2(f_k)$ according to the following formula:

$$\hat{X}2(f_k) = \sum_{i=1}^{L2} B_i \cdot X(f_{k+i}), k = 1, 2, \ldots, Q-L2 \quad (4)$$

where $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is a quantity of frequencies in the first spectrum signal, L2 is an integer less than or equal to Q/2, and a coefficient vector $B=(B_1, B_2, \ldots, B_{L2})$ is obtained according to the following formula:

$$e2(f_k) = X(f_k) - \hat{X}2(f_k) \quad (5)$$

where $X(f_k)$ is a frequency response of a frequency $f_k$ in the first spectrum signal, $e2(f_k)$ is a modeling error, and $e2(f_k)$ uses a criterion in which a p-norm measure is smallest.

Specifically, an optimal solution $B=(B_1, B_2, \ldots, B_{L2})$ for formula (4) may be obtained by using the criterion in which a p-norm measure of the modeling error $e2(f_k)$ is smallest, and by controlling a gain fluctuation range of the FIR recursive filter. Specifically, the least square method or another related mathematical method may be used to obtain the optimal solution $B=(B_1, B_2, \ldots, B_{L2})$ for formula (2), and this is not limited in this embodiment of the present disclosure.

The optimal solution $B=(B_1, B_2, \ldots, B_{L2})$ for formula (4) is substituted into formula (4) to obtain the second mathematical model $\hat{X}2(f_k)$, and then spectrum signals on frequencies $f_l, f_{l+1}, \ldots, f_{l+w}$ are estimated one by one to obtain the fourth spectrum signal $\hat{X}2(f_l), \hat{X}2(f_{l+1}), \ldots \hat{X}2(f_{l+w})$. $f_l$ is a lowest frequency of the fourth spectrum signal, $f_{l+w}$ is the highest frequency of the fourth spectrum signal, the highest frequency of the fourth spectrum signal is lower than the lowest frequency $f_1$ of the first spectrum signal, and the lowest frequency $f_l$ of the fourth spectrum signal is also the lowest frequency of the second spectrum signal. It may be understood that, for example, all intervals between frequencies $f_l, f_{l+1}, \ldots, f_{l+w}$ may be the same, and the interval is the same as an interval between $f_{l+w}$ and $f_1$, and also the same as the interval between the frequencies $f_1, f_2, \ldots,$ and $f_Q$.

Optionally, in this embodiment of the present disclosure, the mathematical model that is used to express the first spectrum signal and that is determined in S131 may be the first mathematical model $\hat{X}1(f_k)$ determined in S131A. Accordingly, the second spectrum signal includes the first spectrum signal $X(f_1), X(f_2), \ldots X(f_Q)$ and the third spectrum signal $\hat{X}1(f_h), \hat{X}1(f_{h+1}), \ldots \hat{X}1(f_{h+m})$ determined according to the first mathematical model $\hat{X}1(f_k)$.

Optionally, in this embodiment of the present disclosure, the mathematical model that is used to express the first spectrum signal and that is determined in S131 may be the second mathematical signal $\hat{X}2(f_k)$ determined in S131B. Accordingly, the second spectrum signal includes the first spectrum signal $X(f_1), X(f_2), \ldots X(f_Q)$ and the fourth spectrum signal $\hat{X}2(f_l), \hat{X}2(f_{l+1}), \ldots \hat{X}2(f_{l+w})$ determined according to the second mathematical model $\hat{X}2(f_k)$.

Optionally, in this embodiment of the present disclosure, the mathematical model that is used to express the first spectrum signal and that is determined in S131 may be the first mathematical model $\hat{X}1(f_k)$ determined in S131A and the second mathematical model $\hat{X}2(f_k)$ determined in S131B. Accordingly, the second spectrum signal includes the third spectrum signal $\hat{X}1(f_h), \hat{X}1(f_{h+1}), \ldots \hat{X}1(f_{h+m})$ determined according to the first mathematical model $\hat{X}1(f_k)$, the first spectrum signal $X(f_1), X(f_2), \ldots X(f_Q)$, and the fourth spectrum signal $\hat{X}2(f_l), \hat{X}2(f_{l+1}), \ldots \hat{X}2(f_{l+w})$ determined according to the second mathematical model $\hat{X}2(f_k)$.

It should be understood that frequencies f of the spectrum signals related in the foregoing description use different subscripts only to distinguish between different frequencies, but not to limit a specific frequency value.

Specifically, as shown in FIG. 2(a), if the received first spectrum signal obtained after the ranging signal is reflected by the at least one reflection point is X(f), $f_1$ is a lowest frequency of the first spectrum signal X(f), $f_Q$ is a highest frequency of the first spectrum signal X(f), and a first spectral width is: $BW1 = f_Q - f_1$.

After high-frequency spectrum spreading and low-frequency spectrum spreading are performed, respectively by using the forward FIR recursive filter (ForWard FIR Filter) and the backward FIR recursive filter (BackWard FIR Filter), on the first spectrum signal X(f) shown in FIG. 2(a), a second spectrum signal X(f)' whose spectral width BW increases to more than 8 times (that is, a second spectral width BW2) is obtained as shown in FIG. (2b).

In S140, in a specific example, a time-domain signal corresponding to the second spectrum signal is obtained, a time-amplitude curve chart of the time-domain signal is generated, a transmission delay d between transmission and reception of the ranging signal (that is, reception of the first spectrum signal obtained after the ranging signal is reflected by the at least one reflection point) may be estimated according to a wave peak location in the time-amplitude curve chart. Then a distance s between the at least one reflection point and the transmitter is obtained by means of calculation according to formula (1).

Optionally, in this embodiment of the present disclosure, the estimating a distance of the at least one reflection point according to the second spectrum signal in S140 includes the following steps.

S141. Obtain a time-domain signal corresponding to the second spectrum signal.

In a specific example, inverse discrete Fourier transformation (Inverse Discrete Fourier Transformation, "IDFT" for short) is performed on the second spectrum signal X(f)' shown in FIG. 2(b), to obtain the corresponding time-domain signal.

S142. Generate a time-amplitude curve chart of the time-domain signal.

Figure 2:
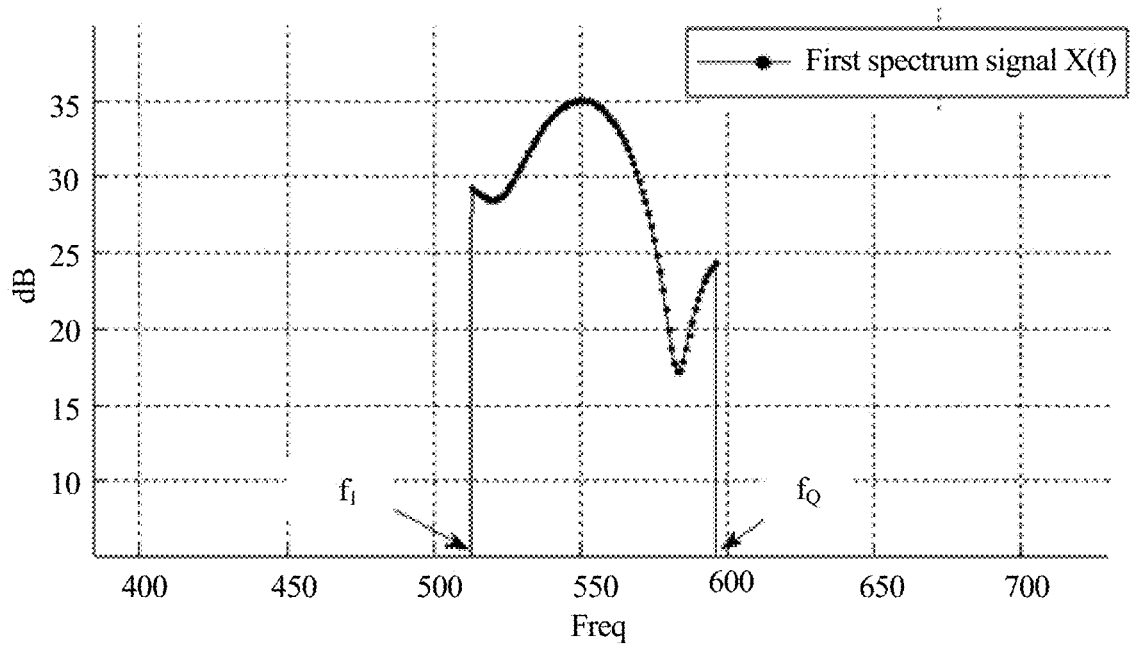
FIGS. 2 (a) and (b) show schematic diagrams of a ranging method according to an embodiment of the present disclosure.
Figure 2:
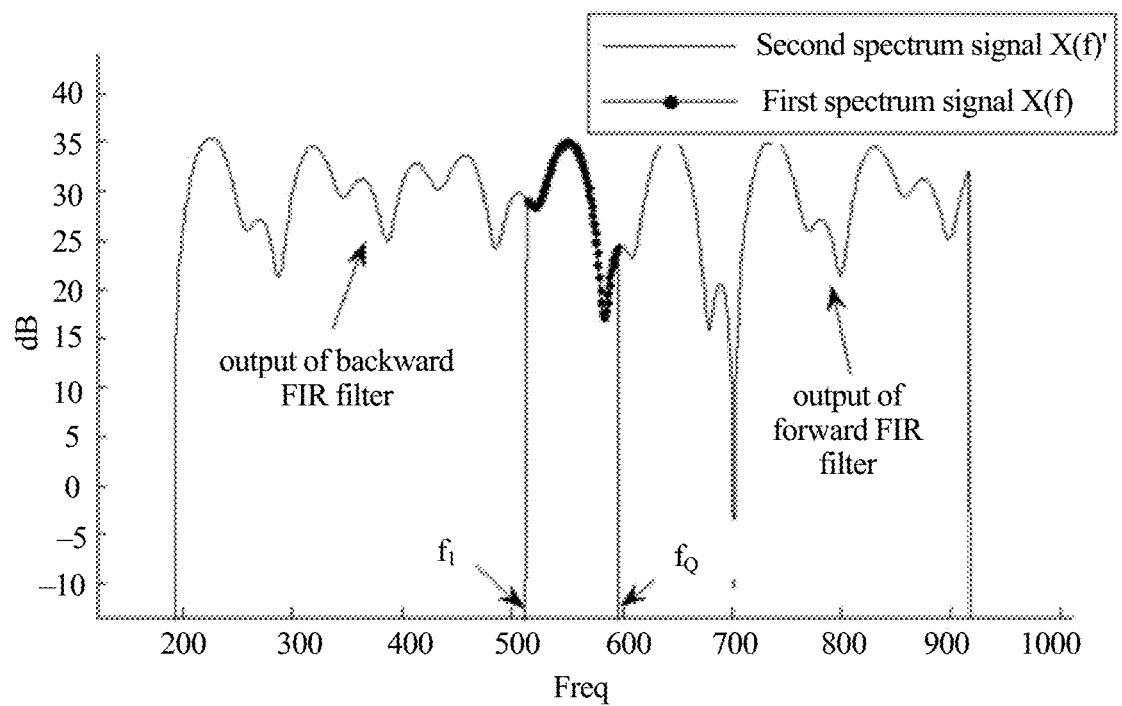
Figure 3:
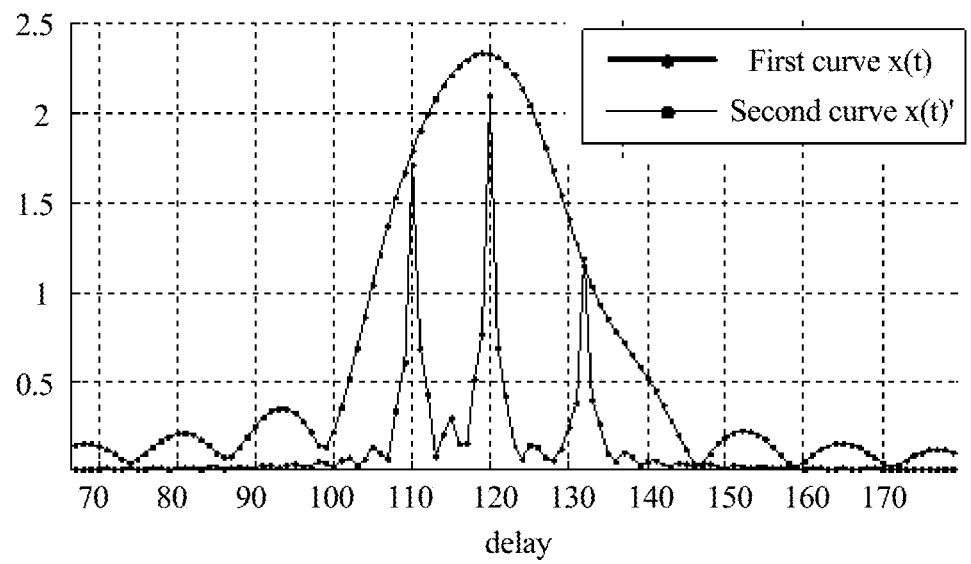
FIG. 3 shows another schematic diagram of a ranging method according to an embodiment of the present disclosure.

Specifically, a time-amplitude curve chart, a second curve x'(t) shown in FIG. 3, is generated for the time-domain signal that is of the second spectrum signal X(f)' shown in FIG. 2(b) and that is obtained in S141. A first curve x(t) in FIG. 3 is a time-amplitude curve chart of a time-domain signal obtained after inverse discrete Fourier transformation is performed on the first spectrum signal X(f) shown in FIG. 2(a).

It can be learned from FIG. 3 that the first curve x(t) that is in a time domain and that is obtained by performing inverse discrete Fourier transformation on the first spectrum signal X(f) that is directly obtained by reflecting by the reflection point in the measured system is a curve obtained by overlapping multiple sine curves (such as the first curve x(t)), and cannot demonstrate a quantity of reflection points and a distance of the reflection point. However, according to the method provided in this embodiment of the present disclosure, spectrum spreading processing is performed on the obtained first spectrum signal, to obtain the second spectrum signal whose spectral width is larger, and then inverse discrete Fourier transformation is performed on the second spectrum signal. The obtained second curve x'(t) (such as the second curve x'(t) shown in FIG. 3) in the time domain has a relatively fine and sharp peak, so as to easily obtain the quantity of reflection points and the distance of the reflection point.

S143. Estimate the distance of the at least one reflection point according to a wave peak location in the time-amplitude curve chart.

Specifically, three highest wave peaks are determined in descending order from multiple wave peaks included in the second curve x'(t) shown in FIG. 3, that is, wave peaks at the locations of 110, 120, and 132 respectively.

Specifically, the second curve x'(t) shown in FIG. 3 includes three sharp and clear wave peaks, and the locations of the three wave peaks are 110, 120, and 132 respectively.

It should be understood that the locations of the three wave peaks shown in FIG. 3 indicate transmission delays d between transmission and reception of the ranging signal, and distances s between three reflection points and the transmitter may be obtained by means of calculation according to formula (1), that is, s=d·V/2.

Optionally, in this embodiment of the present disclosure, a quantity of wave peaks whose amplitudes are relatively large and that are included in the time-amplitude curve chart is S.

The estimating the distance of the at least one reflection point according to a wave peak location in the time-amplitude curve chart in S143 includes the following steps.

S143A. Generate an $i^{th}$ standard sine curve according to a location of an $i^{th}$ wave peak, where a main lobe of the $i^{th}$ standard sine curve is at the location of the $i^{th}$ wave peak, and i is 1, 2, . . . , or S.

Specifically, the standard sine curve is a curve corresponding to a function Sinc(t)=sin(πt)/πt.

S143B. Determine a projection value of each standard sine curve on a time-amplitude curve chart of a time-domain signal corresponding to the first spectrum signal.

S143C. Estimate the distance of the at least one reflection point according to a main lobe location of a target standard sine curve, where the target standard sine curve is a standard sine curve that is in the S standard sine curves and whose projection value is greater than or equal to a preset threshold.

Specifically:

(1). It is assumed that a location of an $Sg^{th}$ wave peak in the S wave peaks of the second curve x'(t) is $d_{sg}$, and a corresponding standard sine curve generated at the location $d_{sg}$ is:

$$h(k, d_{sg}) = \sum_{i=f_1}^{f_Q} e^{\frac{j2\pi i(k-d_{sg})}{N}}, k = 0, 1, 2, \ldots, N-1 \quad (6)$$

where $f_1$ is the lowest frequency of the first spectrum signal, $f_Q$ is the highest frequency of the first spectrum signal, N is a length of inverse discrete Fourier transformation IDFT and is usually equal to Q, and Q is a quantity of frequencies in the first spectrum signal.

(2). A projection value of the standard sine curve shown in formula (6) on the first curve x(t).

$$a_k = \frac{\sum_{n=0}^{N-1} x(f_k) \cdot h^*(k, d_{sg})}{\sum_{n=0}^{N-1} h(k, d_{sg}) \cdot h^*(k, d_{sg})} \quad (7)$$

where $x(f_k)$ is a frequency response of a frequency $f_k$ in the first spectrum signal, and $h^*(k, d_{sg})$ is a conjugate of $h(k, d_{sg})$.

A modulus value $|a_k|$ of the projection value is used as a reflection strength value of a reflection point corresponding to the $Sg^{th}$ wave peak.

According to the foregoing steps, locations d=($d_1$, $d_2$, . . . , $d_S$) of S possible reflection points and strengths a=($|a_1|$, $|a_2|$, . . . , $|a_S|$) of the S possible reflection points are obtained.

Optionally, in this embodiment of the present disclosure, after the locations d=($d_1$, $d_2$, . . . , $d_S$) of S possible reflection points and the strengths a=($|a_1|$, $|a_2|$, . . . , $|a_S|$) of the S possible reflection points are obtained, a strength threshold $A_0$ is set, a sine curve whose projection value is greater than or equal to the strength threshold $A_0$ is determined as the target sinc curve, and a reflection point corresponding to the target sine curve is regarded as an actual reflection point. After processing is completed, M actual reflection points whose projection values are greater than the threshold are obtained.

Figure 4:
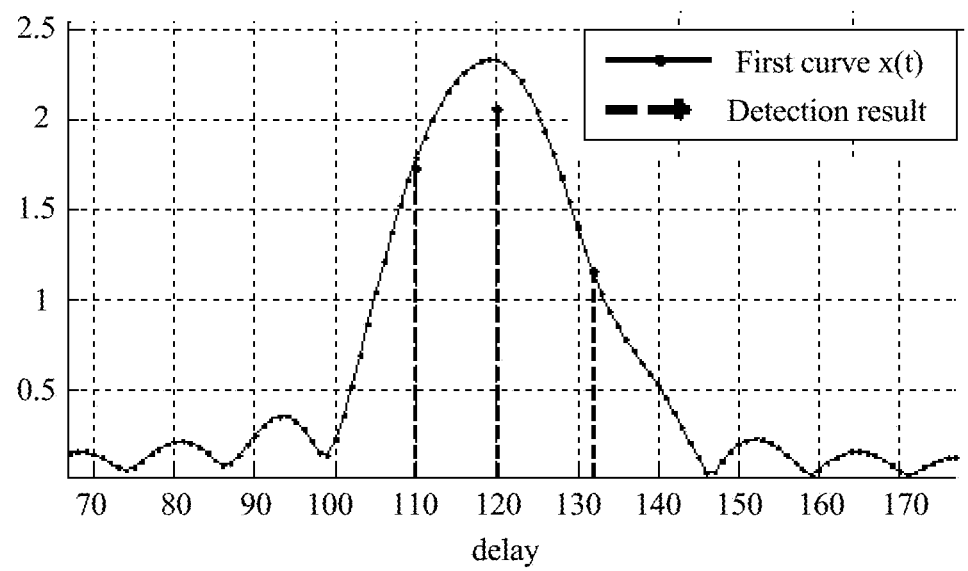
FIG. 4 shows still another schematic diagram of a ranging method according to an embodiment of the present disclosure.

For ease of detection by a user, the M target peak may be marked in the time-amplitude curve chart (such as the first curve x(t) in FIG. 3) of the time-domain signal corresponding to the first spectrum signal, as shown by thick dashed lines in FIG. 4. FIG. 3 is used as an example, and locations and amplitudes of three wave peaks marked in FIG. 4 are d3=(110, 120, 132) and a3=(1.73, 2.06, 1.16) respectively.

It should be understood that for S mutually-overlapped sine curves, a higher sine curve exerts adverse impact on a projection value of a lower sine curve when a projection value is calculated. Optionally, in this embodiment of the present disclosure, after a projection value of an assumed reflection point is obtained, a sine curve corresponding to the reflection point may be deleted from the first curve x(t), and impact of the sine curve disappears accordingly. This is favorable to calculating a subsequent second-largest detected object.

A few of the S pre-estimated peaks may be actually side lobes. After projection and deletion are performed, the side lobes disappear accordingly. Therefore, a quantity M of finally remaining valid peaks is less than or equal to S.

In this embodiment of the present disclosure, another method may be used in S131 to obtain a mathematical model used to express the frequency response of the first spectrum signal. For example, frequency responses of the measured system may be fitted by using an FIR filter, and then a value of any other frequency is directly calculated by using a filter coefficient, so as to improve detection accuracy by spreading a bandwidth.

Optionally, in this embodiment of the present disclosure, the determining a mathematical model used to express the first spectrum signal in S131 includes:

S131C. Fit frequency responses of the first spectrum signal by using a finite impulse response recursive filter, so as to determine the mathematical model.

Specifically, it is assumed that $f_1$ is the lowest frequency of the first spectrum signal, and $f_Q$ is the highest frequency of the first spectrum signal. It may be assumed that the measured system is a linear system, and a transmission characteristic of the measured system may be equivalent to the FIR filter. The FIR filter has L3 orders, L3 is less than Q, and Q is a quantity of frequencies included in the first spectrum signal.

Optionally, in this embodiment of the present disclosure, the fitting frequency responses of the first spectrum signal by using a finite impulse response recursive filter, so as to determine the mathematical model in S131C includes:

determining the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q \tag{8}$$

where N is equal to Q, Q is a quantity of frequencies in the first spectrum signal, L3 is an integer less than N, and a coefficient vector $C=(C_0, C_1, \ldots, C_{L3-1})$ is obtained according to the following formula:

$$e3(f_k) = X(f_k) - Y(f_k) \tag{9}$$

where $X(f_k)$ is a frequency response to a frequency $f_k$ in the first spectrum signal, $e3(f_k)$ is a fitting error, and $e3(f_k)$ uses a criterion in which a p-norm measure is smallest, $f_1$ is the lowest frequency of the first spectrum signal, and $f_Q$ is the highest frequency of the first spectrum signal.

Specifically, an optimal solution $C=(C_0, C_1, \ldots, C_{L3-1})$ for formula (8) may be obtained by using the criterion in which a p-norm measure of the fitting error $e3(f_k)$ is smallest, and by controlling a gain fluctuation range of the FIR filter. Specifically, the least square method or another related mathematical method may be used to obtain the optimal solution $C=(C_0, C_1, \ldots, C_{L3-1})$ for formula (8), and this is not limited in this embodiment of the present disclosure.

The optimal solution $C=(C_0, C_1, \ldots, C_{L3-1})$ is substituted into formula (8) to obtain the mathematical model used to express the first spectrum signal. Then a value on another frequency $f_j$ is calculated according to formula (8). For example, the frequency $f_j$ is lower than the lowest frequency $f_1$ of the first spectrum signal, or the frequency $f_j$ is higher than the highest frequency $f_Q$ of the first spectrum signal. Specifically, for a selection method of $f_j$, refer to the selection method in S131A or S131B. Details are not described herein again.

It should be understood that the user may define the order L3 of the FIR filter according to a specific application requirement.

It should be understood that in this embodiment of the present disclosure, the lowest frequency and the highest frequency of the second spectrum signal may be determined according to an actual requirement, and this is not limited in this embodiment of the present disclosure.

Optionally, in this embodiment of the present disclosure, the determining a second spectrum signal according to the first spectrum signal in S130 includes the following step:

S133. Obtain the second spectrum signal according to the first spectrum signal by using a finite impulse response recursive filter whose group delay is −1.

Specifically, a finite impulse response recursive filter whose group delay is −1 is designed, and then a spectrum of X(f) is spread towards two sides by using a similar method. It should be understood that, the group delay −1 indicates that the FIR filter has a prediction function. For example, when data at a first time point in a preset time sequence is input, the FIR filter whose group delay is −1 can predict data at a second time point. That is, the FIR filter may be a one-step predictor with a fixed coefficient, and can speculate values on other frequencies on two sides of some neighboring data step by step. For example, an interval between the first time point and the second time point may be a smallest time interval for data processing.

It is assumed that the lowest frequency of the first spectrum signal is $f_1$, and the highest frequency of the first spectrum signal is $f_Q$. A special FIR filter is designed, an order of the filter is M, and a filtering equation for performing spectrum spreading on spectrum data X(f) is:

$$\hat{X}3(f_k) = \sum_{i=1}^{M} C_i \cdot X(f_{k+1}), \quad k = l, l-1, \ldots \tag{10}$$

$$\hat{X}4(f_k) = \sum_{i=1}^{M} C_i \cdot X(f_{k-1}), \quad k = h, h+1, \ldots$$

where a frequency $f_l$ is a frequency lower than the lowest frequency $f_1$ of the first spectrum signal, and a frequency $f_h$ is a frequency higher than the highest frequency $f_Q$ of the first spectrum signal.

After IDFT processing is performed on the second spectrum signal shown in formula (10), the time-amplitude curve chart shown in FIG. 3 may also be obtained.

It should be understood that the filtering equation of the FIR filter whose group delay is −1 is irrelevant to detected data, is designed at delivery, and has the following characteristics: (1) A group delay within a passband is equal to −1. (2) A gain within a passband is equal to 1. (3) A gain within a stopband is less than 1.

That a gain of the FIR filter whose group delay is −1 is equal to 1 within a passband means that an output signal amplitude and an input signal amplitude are the same within the passband of the FIR filter. That a gain within a stopband is less than 1 means that an output signal amplitude is less than an input signal amplitude within the stopband of the FIR filter.

It should be understood that in this embodiment of the present disclosure, the lowest frequency and the highest frequency of the second spectrum signal may be determined according to an actual requirement, and this is not limited in this embodiment of the present disclosure.

It should be understood that frequencies f of the spectrum signals related in the foregoing description use different subscripts only to distinguish between different frequencies, but not to limit a specific frequency value.

It should be understood that a larger scanning bandwidth BW in a frequency domain indicates a narrower sine main lobe and a lower side lobe in a time domain after IDFT. On the contrary, a smaller BW indicates a wider main lobe and a higher side lobe. Therefore, in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Inverse discrete Fourier transformation is performed on the second spectrum signal to obtain a time-domain signal. A wave peak in a time-amplitude curve chart of the time-domain signal is finer and sharper, so as to obtain multiple wave peaks in a relatively convenient and accurate manner, determine a distance of the reflection point in the measured system according to locations of the multiple wave peaks, and improve detection accuracy.

Optionally, in this embodiment of the present disclosure, the second spectrum signal that includes the first spectrum signal and whose spectral range is larger than the spectral range of the first spectrum signal may be determined based on another effective method according to the first spectrum signal. For example, in step S131 of determining the mathematical model used to express the first spectrum signal, in addition to using a forward finite impulse response FIR recursive filter and a backward finite impulse response FIR recursive filter or using a finite impulse response FIR recursive filter in the foregoing description, another existing mathematical fitting method may be used to determine the mathematical model used to describe the first spectrum signal, and this is not limited in this embodiment of the present disclosure. Furthermore, in addition to using a finite impulse response recursive filter whose group delay is −1 to obtain the second spectrum signal according to the first spectrum signal in S133, another frequency response filter may be used to obtain, by using an input first spectrum signal, an output second spectrum signal meeting a requirement. This is not limited in this embodiment of the present disclosure.

Optionally, in this embodiment of the present disclosure, a curve fitting method may be used to extract a wave peak in the time-amplitude curve chart of the time-domain signal corresponding to the first spectrum signal. The specific method includes the following steps:

(1) In the time-amplitude curve x(t) of the time-domain signal corresponding to the first spectrum signal $X(f_k)$ k=1, 2, ..., Q, according to an amplitude of the time-amplitude curve x(t), find every location $B=(B_1, B_2, ..., B_P)$ at which a reflection point probably exists.

(2) Generate a corresponding sine curve for each possible reflection point according to the following formula:

$$h(k, B_k) = \sum_{i=f_1}^{f_Q} e^{\frac{j2\pi i(k-B_k)}{N}}, \quad k = 0, 1, 2, \ldots, N-1 \quad (11)$$

where $f_1$ is the lowest frequency of the first spectrum signal, $f_Q$ is the highest frequency of the first spectrum signal, and N is a length of inverse discrete Fourier transformation IDFT.

(3) Use the sine curves to fit x(t).

$$\hat{x}(t) = \sum_{i=1}^{P} C_i \cdot h(k, B_i), \quad k = 0, 1, 2, \ldots, N-1 \quad (12)$$

A fitting error e(t) is:

$$e(t) = x(t) - \hat{x}(t) \quad (13)$$

where e(t) is a fitting error, and uses a criterion in which a p-norm measure is smallest. An optimal fitting coefficient $C=(C_1, C_2, \ldots, C_P)$ for formula (12) may be obtained. Specifically, the least square method or another related mathematical method may be used to obtain the optimal fitting coefficient $C=(C_1, C_2, \ldots, C_P)$ for formula (12), and this is not limited in this embodiment of the present disclosure.

Optionally, in this embodiment of the present disclosure, after the optimal fitting coefficient $C=(C_1, C_2, \ldots, C_P)$ for formula (12) is obtained, a threshold is set based on a largest value of the optimal fitting coefficient. A coefficient greater than the threshold and a location $B_k$ corresponding to the coefficient are selected, that is, a strength and a location of the reflection point are selected.

The time-amplitude curve chart related in this embodiment of the present disclosure may also be referred to as a detection curve chart. Accordingly, the time-amplitude curve may be referred to as a detection curve.

A conventional scanning ranging technology has a problem of a distorted detection curve when there are multiple reflection points. In particular, when these reflection points are close in distance, a wave peak in the detection curve blurs, and consequently, ranging accuracy sharply decreases. In addition, because of impact from a main lobe and a side lobe of a sine curve, the conventional technology further has a disadvantage of a high false alarm and miss rate. Consequently, meaning of the detection curve provided in the conventional technology is unclear and ambiguous, and an equipment operator even with excellent expertise or with specialized training cannot avoid all faults and misses during detection. A further analysis needs to be made on the detection curve with reference to human experience, and therefore it is inconvenient for use.

According to the ranging method provided in this embodiment of the present disclosure, according to a first spectrum signal obtained by reflecting by a reflection point in a measured system, a second spectrum signal whose spectral range is larger than a spectral range of the first spectrum signal is determined by using a modeling and spectrum spreading method. Inverse discrete Fourier transformation is performed on the second spectrum signal to obtain a time-domain signal. A wave peak in a time-amplitude curve chart of the time-domain signal is finer and sharper, so as to obtain multiple wave peaks in a relatively convenient and accurate manner, determine a distance of the reflection point in the measured system according to locations of the multiple wave peaks, and improve detection accuracy. In addition, a standard sine template is generated at a wave peak location, a strength of the reflection point is obtained by using a wave form matching method, and a fault and a miss brought by a main lobe and a side lobe are eliminated, so that a detection result is clear and determinate, and a requirement on an operator is also obviously lowered.

In addition, to achieve same ranging accuracy, the present disclosure effectively reduces hardware costs by using only a relatively narrow scanning bandwidth, and is also less restricted by radio spectrum management and more widely applied.

In the ranging method described in the foregoing, the ranging signal is an electrical signal. It should be understood that the ranging method provided in this embodiment of the present disclosure is also applied to the ranging field using a sound wave, an optical wave, or the like as a carrier. In addition, by using multiple scanning rangefinders disposed at different locations, the ranging method provided in this embodiment of the present disclosure may be used to locate a measured object.

Detailed description of the ranging method 100 according to the embodiment of the present disclosure is provided in the foregoing with reference to FIG. 1 to FIG. 4, and detailed description of a ranging apparatus according to an embodiment of the present disclosure is provided in the following with reference to FIG. 5 to FIG. 6.

Figure 5:
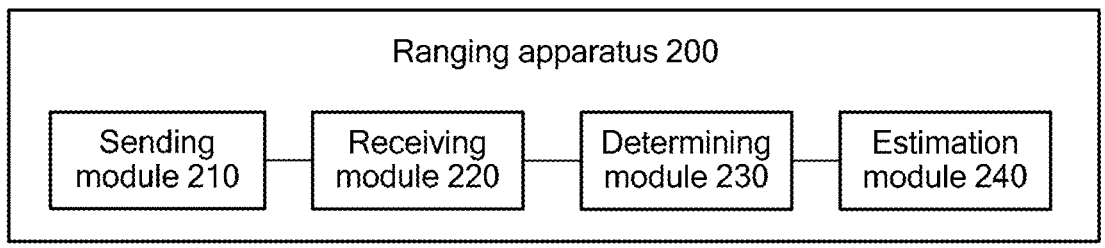
FIG. 5 shows a schematic block diagram of a ranging apparatus according to an embodiment of the present disclosure.

FIG. 5 shows a schematic block diagram of a ranging apparatus 200 according to an embodiment of the present disclosure. The apparatus 200 includes:

a sending module 210, configured to send a ranging signal to a measured system, where the measured system includes at least one reflection point;

a receiving module 220, configured to receive a first spectrum signal obtained after the ranging signal sent by the sending module is reflected by the at least one reflection point;

a determining module 230, configured to determine a second spectrum signal according to the first spectrum signal received by the receiving module, where the second spectrum signal includes the first spectrum signal, and a spectral width of the second spectrum signal is greater than a spectral width of the first spectrum signal; and an estimation module 240, configured to estimate a distance of the at least one reflection point according to the second spectrum signal determined by the determining module.

Therefore, according to the ranging apparatus provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

Optionally, in this embodiment of the present disclosure, the determining module 230 includes:

a first determining unit 231, configured to determine a mathematical model used to express the first spectrum signal; and a second determining unit 232, configured to determine the second spectrum signal according to the mathematical model determined by the first determining unit.

Optionally, in this embodiment of the present disclosure, the second spectrum signal includes a third spectrum signal. A lowest frequency of the third spectrum signal is higher than a highest frequency of the first spectrum signal. The first determining unit 231 includes:

a first modeling subunit 231A, configured to perform mathematical modeling on the first spectrum signal by using a forward finite impulse response recursive filter, so as to obtain a first mathematical model used to express a high frequency signal in the first spectrum signal.

Optionally, in this embodiment of the present disclosure, the first modeling subunit is specifically configured to: determine the first mathematical model $\hat{X}1(k)$ according to the following formula:

determine the first mathematical model $\hat{X}1(f_k)$ according to the following formula:

$$\hat{X}1(f_k) = \sum_{i=1}^{L1} C_i \cdot X(f_{k-i}), \quad k = 1 + L1 \ldots, Q$$

where $X(f_{k-i})$ is a frequency response of a frequency $f_{k-i}$ in the first spectrum signal, $f_1$ is a lowest frequency of the first spectrum signal, $f_Q$ is the highest frequency of the first spectrum signal, Q is a quantity of frequencies in the first spectrum signal, L1 is an integer less than or equal to Q/2, and a coefficient vector $C=(C_1, C_2, \ldots, C_{L1})$ is obtained according to the following formula:

$$e1(f_k) = X(f_k) - \hat{X}1(f_k)$$

where $X(f_k)$ is a frequency response of a frequency $f_k$ in the first spectrum signal, $e1(f_k)$ is a modeling error, and $e1(f_k)$ uses a criterion in which a p-norm measure is smallest.

After the first mathematical mode $\hat{X}1(f_k)$ is obtained, spectrum signals on frequencies $f_h, f_{h+1}, \ldots, f_{h+m}$ may be estimated one by one, that is, the third spectrum signal $\hat{X}1(f_h), \hat{X}1(f_{h+1}), \ldots \hat{X}1(f_{h+m})$ is obtained. $f_h$ is the lowest frequency of the third spectrum signal, $f_{h+m}$ is a highest frequency of the third spectrum signal, the lowest frequency $f_h$ of the third spectrum signal is higher than the highest frequency $f_Q$ of the first spectrum signal, and the highest frequency $f_{h+m}$ of the third spectrum signal is also the highest frequency of the second spectrum signal. It may be understood that, for example, all intervals between frequencies $f_h, f_{h+1}, \ldots, f_{h+m}$ may be the same, and the interval is the same as an interval between $f_h$ and $f_Q$, and also the same as intervals between the frequencies $f_1, f_2, \ldots,$ and $f_Q$.

Optionally, in this embodiment of the present disclosure, the second spectrum signal includes a fourth spectrum signal. A highest frequency of the fourth spectrum signal is lower than a lowest frequency of the first spectrum signal. The second determining unit 231 includes:

a second modeling subunit 231B, configured to perform mathematical modeling on the first spectrum signal by using a backward finite impulse response recursive filter, so as to obtain a second mathematical model used to express a low frequency signal in the first spectrum signal.

Optionally, in this embodiment of the present disclosure, the second modeling subunit is specifically configured to: determine the second mathematical model $\hat{X}2(f_k)$ according to the following formula:

$$\hat{X}2(f_k) = \sum_{i=1}^{L2} B_i \cdot X(f_{k+i}), \quad k = 1, 2, \ldots, Q - L2$$

where $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is a quantity of frequencies in the first spectrum signal, L2 is an integer less than or equal to Q/2, and a coefficient vector $B=(B_1, B_2, \ldots, B_{L2})$ is obtained according to the following formula:

$$e2(f_k) = X(f_k) - \hat{X}2(f_k)$$

where $X(f_k)$ is a frequency response of a frequency $f_k$ in the first spectrum signal, $e2(f_k)$ is a modeling error, and $e2(f_k)$ uses a criterion in which a p-norm measure is smallest.

Optionally, in this embodiment of the present disclosure, the first determining unit 231 is specifically configured to fit frequency responses of the first spectrum signal by using a finite impulse response recursive filter, so as to determine the mathematical model.

Optionally, in this embodiment of the present disclosure, the first determining unit 231 is specifically configured to: determine the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

where N is equal to Q, Q is a quantity of frequencies in the first spectrum signal, L3 is an integer less than N, and a coefficient vector $C=(C_0, C_1, \ldots, C_{L3-1})$ is obtained according to the following formula:

$$e3(f_k)=X(f_k)-Y(f_k)$$

where $X(f_k)$ is a frequency response of a frequency $f_k$ in the first spectrum signal, $e3(f_k)$ is a fitting error, $e3(f_k)$ uses a criterion in which a p-norm measure is smallest, $f_1$ is a lowest frequency of the first spectrum signal, and $f_Q$ is the highest frequency of the first spectrum signal.

After the second mathematical model $\hat{X}2(f_k)$ is obtained, spectrum signals on frequencies $f_l, f_{l+1}, \ldots, f_{l+w}$ may be estimated one by one, that is, the fourth spectrum signal $\hat{X}2(f_l), \hat{X}2(f_{l+1}), \ldots \hat{X}2(f_{l+w})$ is obtained. $f_l$ is a lowest frequency of the fourth spectrum signal, $f_{l+w}$ is the highest frequency of the fourth spectrum signal, and highest frequency of the fourth spectrum signal is lower than the lowest frequency $f_l$ of the first spectrum signal, and the lowest frequency $f_l$ of the fourth spectrum signal is also the lowest frequency of the second spectrum signal. It may be understood that, for example, all intervals between frequencies $f_l, f_{l+1}, \ldots, f_{l+w}$ may be the same, and the interval is the same as an interval between $f_{l+w}$ and $f_1$, and also the same as intervals between the frequencies $f_1, f_2, \ldots,$ and $f_Q$.

Optionally, in this embodiment of the present disclosure, the determining module 230 is specifically configured to obtain the second spectrum signal according to the first spectrum signal by using a finite impulse response recursive filter whose group delay is −1. For a specific manner, refer to description in the foregoing method embodiment. Details are not described herein again.

Optionally, in this embodiment of the present disclosure, the estimation module 240 includes:

an obtaining unit 241, configured to obtain a time-domain signal corresponding to the second spectrum signal;

a generation unit 242, configured to generate a time-amplitude curve chart of the time-domain signal obtained by the obtaining unit; and an estimation unit 243, configured to estimate the distance of the at least one reflection point according to a wave peak location in the time-amplitude curve chart generated by the generation unit.

Optionally, in this embodiment of the present disclosure, a quantity of wave peaks included in the time-amplitude curve chart generated by the generation unit 242 is S.

The estimation unit 243 includes:

a generation subunit 243A, configured to generate an $i^{th}$ standard sine curve according to a location of an $i^{th}$ wave peak in the time-amplitude curve chart generated by the generation unit, where a main lobe of the $i^{th}$ standard sine curve is at the location of the $i^{th}$ wave peak, and i is 1, 2, . . . , or S;

a fourth determining subunit 243B, configured to determine a projection value of each standard sine curve generated by the generation subunit on a time-amplitude curve chart of a time-domain signal corresponding to the first spectrum signal; and an estimation subunit 243C, configured to estimate the distance of the at least one reflection point according to a main lobe location of a target standard sine curve determined by the fourth determining subunit, where the target standard sine curve is a standard sine curve that is in the S standard sine curves and whose projection value is greater than or equal to a preset threshold.

Therefore, according to the ranging apparatus provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

It should be understood that the ranging apparatus 200 according to this embodiment of the present disclosure may be corresponding to the scanning rangefinder in the ranging method in the embodiments of the present disclosure, and the foregoing and other operations and/or functions of the modules of the ranging apparatus 200 are separately used to implement corresponding procedures of the method in FIG. 1 to FIG. 4, and are not further described herein for brevity.

Figure 6:
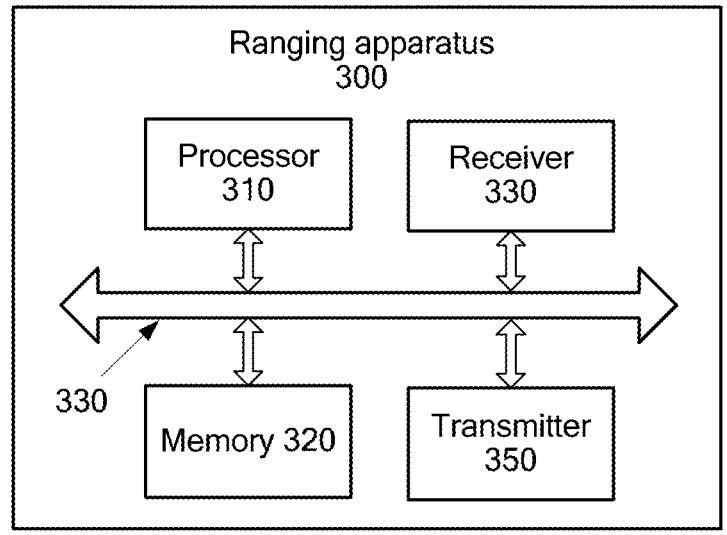
FIG. 6 shows another schematic block diagram of a ranging apparatus according to an embodiment of the present disclosure.

As shown in FIG. 6, an embodiment of the present disclosure further provides a ranging apparatus 300. The apparatus 300 includes a processor 310, a memory 320, a bus system 330, a receiver 340, and a transmitter 350. The processor 310, the memory 320, the receiver 340, and the transmitter 350 are connected to each other by using the bus system 330. The memory 320 is configured to store an instruction. The processor 310 is configured to execute the instruction stored in the memory 320, so as to control the receiver 340 to receive a signal and control the transmitter 350 to send a signal. The transmitter 350 is configured to send a ranging signal to a measured system, and the measured system includes at least one reflection point. The receiver 340 is configured to receive a first spectrum signal obtained after the ranging signal is reflected by the at least one reflection point. The processor 310 is configured to: determine a second spectrum signal according to the first spectrum signal, where the second spectrum signal includes the first spectrum signal, and a spectral width of the second spectrum signal is greater than a spectral width of the first spectrum signal; and estimate a distance of the at least one reflection point according to the second spectrum signal.

Therefore, according to the ranging apparatus provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

Optionally, in an embodiment, the processor 310 is configured to: determine a mathematical model used to express the first spectrum signal; and determine the second spectrum signal according to the mathematical model.

Optionally, in an embodiment, the second spectrum signal includes a third spectrum signal, and a lowest frequency of the third spectrum signal is higher than a highest frequency of the first spectrum signal. The processor 310 is configured to: perform mathematical modeling on the first spectrum signal by using a forward finite impulse response recursive filter, so as to obtain a first mathematical model used to express a high frequency signal in the first spectrum signal.

Optionally, in an embodiment, the processor 310 is specifically configured to:

determine the first mathematical model $\hat{X}1(f_k)$ according to the following formula:

$$\hat{X}1(f_k) = \sum_{i=1}^{L1} C_i \cdot X(f_{k-i}), \quad k = 1 + L1 \ldots, Q$$

where $X(f_{k-i})$ is a frequency response of a frequency $f_{k-i}$ in the first spectrum signal, $f_1$ is the lowest frequency of the first spectrum signal, $f_Q$ is the highest frequency of the first spectrum signal, Q is a quantity of frequencies in the first spectrum signal, L1 is an integer less than or equal to Q/2, and a coefficient vector $C=(C_1, C_2, \ldots, C_{L1})$ is obtained according to the following formula:

$$e1(f_k)=X(f_k)-\hat{X}1(f_k)$$

where $X(f_k)$ is a frequency response of a frequency $f_k$ in the first spectrum signal, $e1(f_k)$ is a modeling error, and $e1(f_k)$ uses a criterion in which a p-norm measure is smallest.

After the first mathematical model $\hat{X}1(f_k)$ is obtained, spectrum signal on frequencies $f_h, f_{h+1}, \ldots, f_{h+m}$ may be estimated one by one, that is, the third spectrum signal $\hat{X}1(f_h), \hat{X}1(f_{h+1}), \ldots \hat{X}1(f_{h+m})$ is obtained. $f_h$ is the lowest frequency of the third spectrum signal, $f_{h+m}$ is a highest frequency of the third spectrum signal, the lowest frequency $f_h$ of the third spectrum signal is higher than the highest frequency $f_Q$ of the first spectrum signal, and the highest frequency $f_{h+m}$ of the third spectrum signal is also the highest frequency of the second spectrum signal. It may be understood that, for example, all intervals between frequencies $f_h, f_{h+1}, \ldots, f_{h+m}$ may be the same, and the interval is the same as an interval between $f_h$ and $f_Q$, and also the same as intervals between the frequencies $f_1, f_2, \ldots,$ and $f_Q$.

Optionally, in an embodiment, the second spectrum signal includes a fourth spectrum signal, and a highest frequency of the fourth spectrum signal is lower than a lowest frequency of the first spectrum signal. The processor 310 is configured to: perform mathematical modeling on the first spectrum signal by using a backward finite impulse response recursive filter, so as to obtain a second mathematical model used to express a low frequency signal in the first spectrum signal.

Optionally, in an embodiment, the processor 310 is specifically configured to determine the second mathematical model $\hat{X}2(f_k)$ according to the following formula:

$$\hat{X}2(f_k) = \sum_{i=1}^{L2} B_i \cdot X(f_{k+i}), \quad k = 1, 2, \ldots, Q-L2$$

where $X(f_{k+i})$ is a frequency response of a frequency $f_{k+i}$ in the first spectrum signal, $f_1$ is the lowest frequency of the first spectrum signal, $f_Q$ is a highest frequency of the first spectrum signal, Q is a quantity of frequencies in the first spectrum signal, L2 is an integer less than or equal to Q/2, and a coefficient vector $B=(B_1, B_2, \ldots, B_{L2})$ is obtained according to the following formula:

$$e2(f_k)=X(f_k)-\hat{X}2(f_k)$$

where $X(f_k)$ is a frequency response of a frequency $f_k$ in the first spectrum signal, $e2(f_k)$ is a modeling error, and $e2(f_k)$ uses a criterion in which a p-norm measure is smallest.

After the second mathematical model $\hat{X}2(f_k)$ is obtained, spectrum signals on frequencies $f_l, f_{l+1}, \ldots, f_{l+w}$ may be estimated one by one, that is, the fourth spectrum signal $\hat{X}2(f_l), \hat{X}2(f_{l+1}), \ldots \hat{X}2(f_{l+w})$ is obtained. $f_l$ is a lowest frequency of the fourth spectrum signal, $f_{l+w}$ is the highest frequency of the fourth spectrum signal, the highest frequency of the fourth spectrum signal is lower than the lowest frequency $f_1$ of the first spectrum signal, and the lowest frequency $f_l$ of the fourth spectrum signal is also the lowest frequency of the second spectrum signal. It may be understood that, for example, all intervals between frequencies $f_l, f_{l+1}, \ldots, f_{l+w}$ may be the same, and the interval is the same as an interval between $f_{l+w}$ and $f_1$, and also the same as intervals between the frequencies $f_1, f_2, \ldots,$ and $f_Q$.

Optionally, in an embodiment, the processor 310 is specifically configured to fit frequency responses of the first spectrum signal by using a finite impulse response recursive filter, so as to determine the mathematical model.

Optionally, in an embodiment, the processor 310 is specifically configured to determine the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

where N is equal to Q, Q is a quantity of frequencies in the first spectrum signal, L3 is an integer less than N, and a coefficient vector $C=(C_0, C_1, \ldots, C_{L3-1})$ is obtained according to the following formula:

$$e3(f_k)=X(f_k)-Y(f_k)$$

where $X(f_k)$ is a frequency response of a frequency $f_k$ in the first spectrum signal, $e3(f_k)$ is a fitting error, $e3(f_k)$ uses a criterion in which a p-norm measure is smallest, $f_1$ is a lowest frequency of the first spectrum signal, and $f_Q$ is a highest frequency of the first spectrum signal.

Optionally, in an embodiment, the processor 310 is specifically configured to obtain the second spectrum signal according to the first spectrum signal by using a finite impulse response recursive filter whose group delay is −1.

Optionally, in an embodiment, the processor 310 is specifically configured to: obtain a time-domain signal corresponding to the second spectrum signal;

generate a time-amplitude curve chart of the time-domain signal; and estimate the distance of the at least one reflection point according to a wave peak location in the time-amplitude curve chart.

Optionally, in an embodiment, a quantity of wave peaks included in the time-amplitude curve chart is S. The processor 310 is specifically configured to: generate an $i^{th}$ standard sine curve according to a location of an $i^{th}$ wave peak, where a main lobe of the $i^{th}$ standard sine curve is at the location of the $i^{th}$ wave peak, and i is 1, 2, . . . , or S; determine a projection value of each standard sine curve on a time-amplitude curve chart of a time-domain signal corresponding to the first spectrum signal; and estimate the distance of the at least one reflection point according to a main lobe location of a target standard sine curve, where the target standard sine curve is a standard sine curve that is in the S standard sine curves and whose projection value is greater than or equal to a preset threshold.

It should be understood that, in this embodiment of the present disclosure, the processor 310 may be a central processing unit (Central Processing Unit, "CPU" for short), or the processor 310 may be another general purpose processor, a digital signal processor (DSP), an application-specific integrated circuit (ASIC), a field programmable gate array (FPGA) or another programmable logic device, a discrete gate or transistor logic device, a discrete hardware component, or the like. The general purpose processor may be a microprocessor, or the processor may be any normal processor or the like.

The memory 320 may include a read-only memory and a random access memory, and provide an instruction and data to the processor 310. Apart of the memory 320 may further include a nonvolatile random access memory. For example, the memory 320 may further store device type information.

In addition to a data bus, the bus system 330 may further include a power bus, a control bus, a status signal bus, and the like. However, for clarity of description, various buses are marked as the bus system 330 in the figure.

In an implementation process, the steps in the foregoing method may be completed by using an integrated logic circuit of hardware in the processor 310 or an instruction in a form of software. The steps of the method disclosed with reference to the embodiments of the present disclosure may be directly performed by a hardware processor, or may be performed by using a combination of hardware and a software module in the processor. The software module may be located in a mature storage medium in the field, such as a random access memory, a flash memory, a read-only memory, a programmable read-only memory, an electrically-erasable programmable memory, or a register. The storage medium is located in the memory 320. The processor 310 reads information from the memory 320, and implements the steps of the foregoing method in combination with the hardware in the processor 310. To avoid repetition, details are not described herein again.

Therefore, according to the ranging apparatus provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy.

It should be understood that the ranging apparatus 300 according to this embodiment of the present disclosure may be corresponding to the scanning rangefinder in the ranging method in the embodiments of the present disclosure, or may be corresponding to the ranging apparatus 200 according to the embodiments of the present disclosure, and the foregoing and other operations and/or functions of the modules of the ranging apparatus 300 are separately used to implement corresponding procedures of the method in FIG. 1 to FIG. 4, and are not further described herein for brevity.

Figure 7:
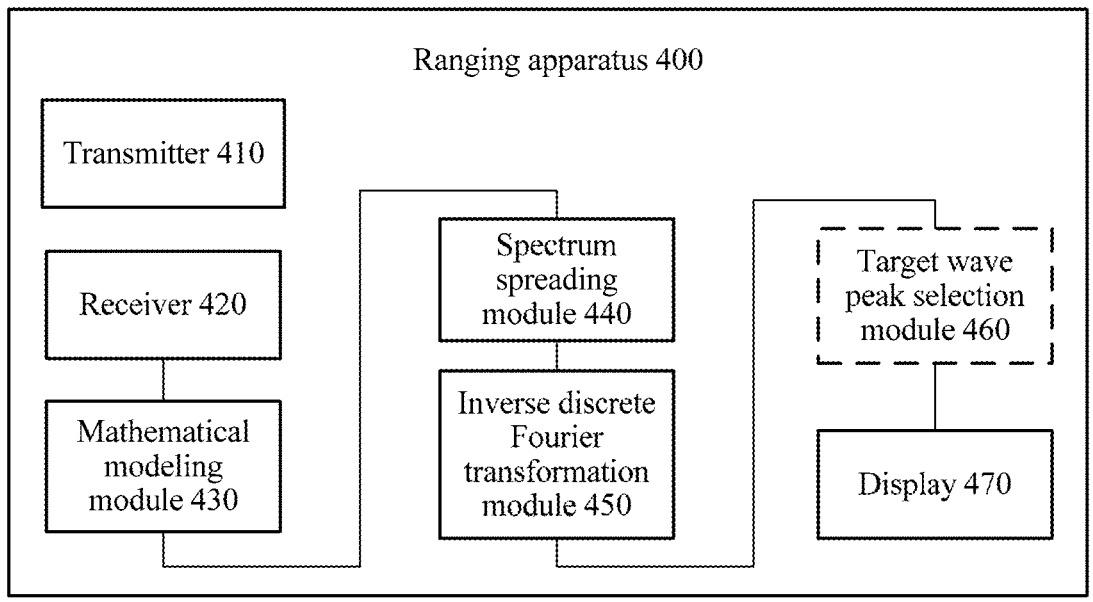
FIG. 7 shows still another schematic block diagram of a ranging apparatus according to an embodiment of the present disclosure.

FIG. 7 shows a schematic block diagram of a ranging apparatus 400 according to an embodiment of the present disclosure. As shown in FIG. 7, the apparatus 400 includes: a transmitter 410, a receiver 420, a mathematical modeling module 430, a spectrum spreading module 440, an inverse discrete Fourier transformation module 450, a target wave peak selection module 460, and a display 470.

The transmitter 410 is configured to send a ranging signal to a measured system, and the measured system includes at least one reflection point.

The receiver 420 is configured to receive a first spectrum signal obtained after the ranging signal sent by the transmitter 410 is reflected by the at least one reflection point.

In a specific example, the first spectrum signal X(f) shown in FIG. 2(*a*) is received.

The mathematical modeling module 430 is configured to determine a mathematical model used to express the first spectrum signal.

In a specific example, the mathematical model used to express the first spectrum signal is determined by using the foregoing method in S131A, S131B, or S131C. For a specific process, refer to the foregoing description. Details are not described herein again for brevity.

The spectrum spreading module 440 is configured to determine a second spectrum signal according to the mathematical model determined by the mathematical modeling module 430. The second spectrum signal includes the first spectrum signal, and a spectral width of the second spectrum signal is greater than a spectral width of the first spectrum signal.

By way of example and not limitation, the spectral width of the second spectrum signal X(f)' shown in FIG. 2(*b*) increases to more than 8 times relative to the spectral width of the first spectrum signal X(f).

The inverse discrete Fourier transformation module 450 is configured to perform inverse discrete Fourier transformation on the second spectrum signal determined by the spectrum spreading module 440, so as to obtain a time-domain signal corresponding to the second spectrum signal.

Specifically, the inverse discrete Fourier transformation module 450 generates a time-amplitude curve chart, as shown by the second curve x'(t) in FIG. 3, of the time-domain signal that is of the second spectrum signal X(f)' shown in FIG. 2(*b*) and is obtained by the spectrum spreading module 440.

The target wave peak selection module 460 is configured to select a target wave peak from the time-domain signal that is corresponding to the second spectrum signal and that is determined by the inverse discrete Fourier transformation module 450.

In a specific example, the target wave peak is selected from the time-amplitude curve chart (the second curve x'(t) shown in FIG. 3) that is of the time-domain signal of the second spectrum signal X(f)' and that is determined by the inverse discrete Fourier transformation module 450, for example, wave peaks at locations of 110, 120, and 132 respectively are selected as the target wave peak.

The display 470 is configured to display a location and an amplitude of the target wave peak determined by the target wave peak selection module 460.

Specifically, as shown in FIG. 4, the target wave peak (such as three wave peaks shown in FIG. 4) determined by the target wave peak selection module 460 is displayed on a user display interface. Optionally, both the location and the amplitude of the target wave peak may be displayed. Locations of the three target wave peaks shown in FIG. 4 are 110, 120, and 132 respectively, and amplitudes are 1.74, 2.06, and 1.15 respectively.

FIG. 4 may also be referred to as a distance-strength distribution diagram of the at least one reflection point. It should be understood that horizontal coordinate locations of the three wave peaks in FIG. 4 are corresponding to the distance of the at least one reflection point (for example, three reflection points), and vertical coordinate locations of the three wave peaks in FIG. 4 are corresponding to a strength of the at least one reflection point (for example, three reflection points).

A user can conveniently analyze a status of the reflection point in the measured system by using a display result that is shown in FIG. 4 and that is displayed by the display 470.

Therefore, according to the ranging apparatus provided in this embodiment of the present disclosure, according to a first spectrum signal obtained by reflecting by a reflection point in a measured system, a second spectrum signal whose spectral range is larger than a spectral range of the first spectrum signal is determined, and the second spectrum signal includes the first spectrum signal. Then a distance of the reflection point in the measured system can be determined according to the second spectrum signal in a relatively accurate manner, thereby improving ranging accuracy, and improving user experience.

Optionally, the ranging apparatus 400 provided in this embodiment of the present disclosure may also be referred to as a scanning rangefinder.

It should be understood that the ranging apparatus 400 according to this embodiment of the present disclosure may be corresponding to the scanning rangefinder in the ranging method in the embodiments of the present disclosure; or the ranging apparatus 400 may be corresponding to the ranging apparatus 200 according to the embodiments of the present disclosure. Specifically, the transmitter 410 may be corresponding to the sending module 210, the receiver 420 may be corresponding to the receiving module 220, the mathematical modeling module 430 may be corresponding to the first determining unit 231, the spectrum spreading module 440 may be corresponding to the second determining unit 232, the inverse discrete Fourier transformation module 450 may be corresponding to a combination of the obtaining unit 241 and the generation unit 242, and the target wave peak selection module 460 may be corresponding to the estimation unit 243. The ranging apparatus 400 may also be corresponding to the ranging apparatus 300 according to the embodiments of the present disclosure. The foregoing and other operations and/or functions of the modules of the ranging apparatus 400 are separately used to implement corresponding procedures of the method in FIG. 1 to FIG. 4, and are not further described herein for brevity.

It should be further understood that first, second, third, fourth, and all numbers related in this specification are distinguished only for ease description, and are not used to limit a scope of embodiments of the present disclosure.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present disclosure. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A ranging method, comprising:
    sending a ranging signal to a measured system, wherein the measured system comprises at least one reflection point;
    receiving a first spectrum signal obtained after the ranging signal is reflected by the at least one reflection point;
    determining a mathematical model used to express the first spectrum signal using a forward finite impulse response recursive filter, so as to obtain a first mathematical model used to express a high frequency signal in the first spectrum signal;

determining a second spectrum signal according to the mathematical model, wherein the second spectrum signal comprises the first spectrum signal, and a spectral width of the second spectrum signal is greater than a spectral width of the first spectrum signal; and estimating a distance of the at least one reflection point according to the second spectrum signal, wherein the second spectrum signal comprises a third spectrum signal, and a lowest frequency of the third spectrum signal is higher than a highest frequency of the first spectrum signal.

2. The method according to claim 1, wherein performing the mathematical modeling on the first spectrum signal by using the forward finite impulse response recursive filter, so as to obtain the first mathematical model used to express the high frequency signal in the first spectrum signal comprises:

determining the first mathematical model $\hat{X}1(f_k)$ according to the following formula:

$$\hat{X}1(f_k) = \sum_{i=1}^{L1} C_i \cdot X(f_{k-i}), \quad k = 1 + L1 \ldots, Q$$

wherein $X(f_{k-i})$ is a frequency response of a frequency $(f_{k-i})$ in the first spectrum signal, $f_1$ is a lowest frequency of the first spectrum signal, $f_Q$ is the highest frequency of the first spectrum signal, Q is a quantity of frequencies in the first spectrum signal, L1 is an integer less than or equal to Q/2, and a coefficient vector $C=(C_1, C_2, \ldots, C_{L1})$ is obtained according to the following formula:

$$e1(f_k)=X(f_k)-\hat{X}1(f_k)$$

wherein $X(f_k)$ is a frequency response of a frequency $(f_k)$ in the first spectrum signal, $e1(f_k)$ is a modeling error, and $e1(f_k)$ uses a criterion in which a p-norm measure is smallest.

3. The method according to claim 1, wherein:

the second spectrum signal comprises a fourth spectrum signal, and a highest frequency of the fourth spectrum signal is lower than the lowest frequency of the first spectrum signal; and determining the mathematical model used to express the first spectrum signal comprises:

performing mathematical modeling on the first spectrum signal by using a backward finite impulse response recursive filter, so as to obtain a second mathematical model used to express a low frequency signal in the first spectrum signal.

4. The method according to claim 3, wherein performing the mathematical modeling on the first spectrum signal by using the backward finite impulse response recursive filter, so as to obtain the second mathematical model used to express the low frequency signal in the first spectrum signal comprises:

determining the second mathematical model $\hat{X}2(f_k)$ according to the following formula:

$$\hat{X}2(f_k) = \sum_{i=1}^{L2} B_i \cdot X(f_{k+i}), \quad k = 1, 2, \ldots, Q - L2$$

wherein $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is the quantity of frequencies in the first spectrum signal, L2 is an integer less than or equal to Q/2, and a coefficient vector $B=(B_1, B_2, \ldots, B_{L2})$ is obtained according to the following formula:

$$e2(f_k)=X(f_k)-\hat{X}2(f_k)$$

wherein $X(f_k)$ is the frequency response of the frequency $f_k$ in the first spectrum signal, $e2(f_k)$ is a modeling error, and $e2(f_k)$ uses a criterion in which a p-norm measure is smallest.

5. The method according to claim 1, wherein determining the mathematical model used to express the first spectrum signal comprises:

fitting frequency responses of the first spectrum signal by using a finite impulse response recursive filter, so as to determine the mathematical model.

6. The method according to claim 5, wherein fitting the frequency responses of the first spectrum signal by using the finite impulse response recursive filter, so as to determine the mathematical model comprises:

determining the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

wherein N n is equal to Q, Q is a quantity of frequencies in the first spectrum signal, L3 is an integer less than N and a coefficient vector $C=(C_0, C_1, \ldots, C_{L3-1})$ is obtained according to the following formula:

$$e3(f_k)=X(f_k)-Y(f_k)$$

wherein $X(f_k)$ is a frequency response of a frequency $f_k$ in the first spectrum signal, $e3(f_k)$ is a fitting error, $e3(f_k)$ uses a criterion in which a p-norm measure is smallest, $f_1$ is a lowest frequency of the first spectrum signal, and $f_Q$ is a highest frequency of the first spectrum signal.

7. The method according to claim 1, wherein determining the second spectrum signal according to the first spectrum signal comprises:

obtaining the second spectrum signal according to the first spectrum signal by using a finite impulse response recursive filter whose group delay is −1.

8. The method according to claim 1, wherein estimating the distance of the at least one reflection point according to the second spectrum signal comprises:

obtaining a time-domain signal corresponding to the second spectrum signal;

generating a time-amplitude curve chart of the time-domain signal; and estimating the distance of the at least one reflection point according to a wave peak location in the time-amplitude curve chart.

9. The method according to claim 8, wherein:

a quantity of wave peaks comprised in the time-amplitude curve chart is S; and estimating the distance of the at least one reflection point according to the wave peak location in the time-amplitude curve comprises:

generating an $i^{th}$ standard sine curve according to a location of an $i^{th}$ wave peak, wherein a main lobe of the $i^{th}$ standard sine curve is at the location of the $i^{th}$ wave peak, and i is 1, 2, . . . , or S, determining a projection value of each standard sine curve on a time-amplitude curve chart of time-domain signal corresponding to the first spectrum signal, and estimating the distance of the at least one reflection point according to a main lobe location of a target standard sine curve, wherein the target standard sine curve is a standard sine curve that is in the S standard sine curves and whose projection value is greater than or equal to a preset threshold.

10. A ranging apparatus, comprising:
a transmitter, configured to send a ranging signal to a measured system, wherein the measured system comprises at least one reflection point;
a receiver, configured to receive a first spectrum signal obtained after the ranging signal sent by the transmitter is reflected by the at least one reflection point; and
a processor, configured to:
determine a mathematical model used to express the first spectrum signal using a forward finite impulse response recursive filter, so as to obtain a first mathematical model used to express a high frequency signal in the first spectrum signal;
determine a second spectrum signal according to the mathematical model, wherein the second spectrum signal comprises the first spectrum signal, and a spectral width of the second spectrum signal is greater than a spectral width of the first spectrum signal, and
estimate a distance of the at least one reflection point according to the second spectrum signal, wherein the second spectrum signal comprises a third spectrum signal, and a lowest frequency of the third spectrum signal is higher than a highest frequency of the first spectrum signal.

11. The apparatus according to claim 10, wherein the processor is further configured to determine the first mathematical model $\hat{X}1(k)$ according to the following formula:

$$\hat{X}1(f_k) = \sum_{i=1}^{L1} C_i \cdot X(f_{k-i}), \quad k = 1+L1 \ldots, Q$$

wherein $X(f_{k-i})$ is a frequency response of a frequency $(f_{k-i})$ in the first spectrum signal, $f_1$ is a lowest frequency of the first spectrum signal, $f_Q$ is the highest frequency of the first spectrum signal, Q is a quantity of frequencies in the first spectrum signal, L1 is an integer less than or equal to Q/2, and coefficient vector $C=C_1, C_2, \ldots, C_{L1}$ is obtained according to the following formula:

$$e1(f_k)=X(f_k)-\hat{X}1(f_k)$$

wherein $X(f_k)$ is a frequency response of a frequency $f_k$ in the first spectrum signal, $e1(f_k)$ is a modeling error, and $e1(f_k)$ uses a criterion in which a p-norm measure is smallest.

12. The apparatus according to claim 10, wherein:
the second spectrum signal comprises a fourth spectrum signal, and a highest frequency of the fourth spectrum signal is lower than the lowest frequency of the first spectrum signal; and the processor is further configured to:
perform mathematical modeling on the first spectrum signal by using a backward finite impulse response recursive filter, so as to obtain a second mathematical model used to express a low frequency signal in the first spectrum signal.

13. The apparatus according to claim 12, wherein the processor is further configured to determine the second mathematical model $\hat{X}2(f_k)$ according to the following formula:

$$\hat{X}2(f_k) = \sum_{i=1}^{L2} B_i \cdot X(f_{k+i}), \quad k = 1, 2, \ldots, Q-L2$$

wherein $X(f_{k+i})$ is a frequency response of a frequency $f_{k+i}$ in the first spectrum signal, $f_1$ is the lowest frequency of the first spectrum signal, $f_Q$ is the highest frequency of the first spectrum signal, Q is the quantity of frequencies in the first spectrum signal, L2 is an integer less than or equal to Q/2, and a coefficient vector $B=B_1, B_2, \ldots, B_{L2}$ is obtained according to the following formula:

$$e2(f_k)=-\hat{X}2(f_k)$$

wherein $X(f_k)$ is the frequency response of the frequency $f_k$ in the first spectrum signal, $e2(f_k)$ is a modeling error, and $e2(f_k)$ uses a criterion in which a p-norm measure is smallest.

14. The apparatus according to claim 10, wherein the processor is further configured to fit frequency responses of the first spectrum signal by using a finite impulse response recursive filter, so as to determine the mathematical model.

15. The apparatus according to claim 14, wherein the processor is further configured to determine the mathematical model $Y(f_k)$ according to the following formula:

$$Y(f_k) = \sum_{i=0}^{L3-1} C_i \cdot e^{\frac{-j2\pi i f_k}{N}} \quad k = 1, 2, \ldots, Q$$

wherein N is equal to Q, Q is a quantity of frequencies in the first spectrum signal, L3 is an integer less than N, and a coefficient vector $C=C_0, C_1, \ldots, C_{L3-1}$ is obtained according to the following formula:

$$e3(f_k)=X(f_k)-Y(f_k)$$

wherein $X(f_k)$ is a frequency response of a frequency $f_k$ in the first spectrum signal, $e3(f_k)$ is a fitting error, $e3(f_k)$ uses a criterion in which a p-norm measure is smallest, $f_1$ is a lowest frequency of the first spectrum signal, and $f_Q$ is a highest frequency of the first spectrum signal.

16. The apparatus according to claim 10, wherein the processor is further configured to obtain the second spectrum signal according to the first spectrum signal by using a finite impulse response recursive filter whose group delay is −1.

* * * * *

UNITED STATES PATENT AND TRADEMARK OFFICE
CERTIFICATE OF CORRECTION

PATENT NO. : 10,578,729 B2
APPLICATION NO. : 15/677574
DATED : March 3, 2020
INVENTOR(S) : Wang It is certified that error appears in the above-identified patent and that said Letters Patent is hereby corrected as shown below:

In the Claims

Claim 9, Column 31, Line 9:
"sine curves and whose proj ection"
Should read:
-- sine curves and whose projection --.

Signed and Sealed this
Tenth Day of November, 2020

Andrei Iancu
*Director of the United States Patent and Trademark Office*